US012628368B2

(12) United States Patent
Nonoda et al.

(10) Patent No.: US 12,628,368 B2
(45) Date of Patent: May 12, 2026

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Ryohei Nonoda, Tokyo (JP); Atsushi Era, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1201 days.

(21) Appl. No.: 17/281,820

(22) PCT Filed: Feb. 5, 2019

(86) PCT No.: PCT/JP2019/004006
§ 371 (c)(1),
(2) Date: Mar. 31, 2021

(87) PCT Pub. No.: WO2020/161791
PCT Pub. Date: Aug. 13, 2020

(65) Prior Publication Data
US 2022/0020870 A1 Jan. 20, 2022

(51) Int. Cl.
*H10D 30/47* (2025.01)
*H10D 62/85* (2025.01)

(52) U.S. Cl.
CPC ....... *H10D 30/475* (2025.01); *H10D 62/8503* (2025.01)

(58) Field of Classification Search
CPC ............. H01L 29/7786; H01L 29/2003; H01L 21/02458; H01L 21/02505; H01L 21/0254
See application file for complete search history.

(56) References Cited

U.S. PATENT DOCUMENTS 9,608,075 B1 3/2017 Wan et al.
10,186,421 B2 * 1/2019 Fukazawa ......... H01L 21/02507
(Continued)

FOREIGN PATENT DOCUMENTS

CN 103545361 A 1/2014
CN 103715246 A 4/2014
(Continued)

OTHER PUBLICATIONS

Office Action issued in DE 11 2019 006 829.6; mailed by the German Patent and Trade Mark Office on Jul. 1, 2022.
(Continued)

*Primary Examiner* — Jay C Kim
*Assistant Examiner* — Woo K Lee
(74) *Attorney, Agent, or Firm* — Studebaker Brackett PLLC

(57) ABSTRACT

A semiconductor device according to the present invention includes a substrate, a plurality of semiconductor layers to be overlaid on the substrate and a gate electrode, a drain electrode, and a source electrode provided on the plurality of semiconductor layers, wherein each of the plurality of semiconductor layers includes a channel layer made with GaN and a barrier layer provided in contact with an upper surface of the channel layer and made with $Al_xGa_{1-x}N$, and a carbon concentration of the channel layer included in an uppermost semiconductor layer among the plurality of semiconductor layers is lower than an average value of carbon concentration of the channel layer included in the at least one semiconductor layer other than the uppermost semiconductor layer among the plurality of semiconductor layers.

10 Claims, 3 Drawing Sheets

100
26  24  28

22 ⎫
20a ⎬ 21
20 ⎭
18 ⎫
16a ⎬ 17
16 ⎭
14
12
10

(56)                References Cited

U.S. PATENT DOCUMENTS

| | | | |
|---|---|---|---|
| 2006/0131607 | A1 | 6/2006 | Yamada et al. |
| 2014/0015608 | A1 | 1/2014 | Kotani et al. |
| 2014/0091318 | A1 | 4/2014 | Ishiguro et al. |
| 2015/0372124 | A1 | 12/2015 | Isobe et al. |
| 2016/0099345 | A1 | 4/2016 | Ramer et al. |
| 2018/0053647 | A1 | 2/2018 | Fukazawa et al. |
| 2019/0006501 | A1 | 1/2019 | Yang et al. |

FOREIGN PATENT DOCUMENTS

| | | |
|---|---|---|
| CN | 105304783 A | 2/2016 |
| CN | 106158946 A | 11/2016 |
| CN | 107408511 A | 11/2017 |
| CN | 109216447 A | 1/2019 |
| JP | 2011-077396 A | 4/2011 |
| WO | 0065663 A1 | 11/2000 |

OTHER PUBLICATIONS

International Search Report; Written Opinion; and Notification of Transmittal of the International Search Report and the Written Opinion of the International Searching Authority, or the Declaration issued in PCT/JP2019/004006; mailed May 7, 2019.

An Office Action mailed by the Korean Intellectual Property Office on Nov. 30, 2022, which corresponds to Korean Patent Application No. 10-2021-7018306 and is related to U.S. Appl. No. 17/281,820; with English language translation.

An Office Action issued by the State Intellectual Property Office of the People's Republic of China on Jan. 11, 2024, which corresponds to Chinese Patent Application No. CN 201980088306.8.

An Office Action mailed by China National Intellectual Property Administration on Nov. 21, 2024, which corresponds to Chinese Patent Application No. 201980088306.8 and is related to U.S. Appl. No. 17/281,820; with English language translation.

An Office Action mailed by China National Intellectual Property Administration on Jul. 27, 2024, which corresponds to Chinese Patent Application No. 201980088306.8 and is related to U.S. Appl. No. 17/281,820; with English language translation.

* cited by examiner

GROWTH
TEMPERATURE
GROWTH
PRESSURE

Al SOURCE GAS

Ga SOURCE GAS

N SOURCE GAS

SECOND
STEP

THIRD
STEP

FOURTH
STEP

GROWTH
INTERRUPTION
STEP

GROWTH
INTERRUPTION
STEP

GROWTH
TEMPERATURE
GROWTH
PRESSURE

Al SOURCE GAS

Ga SOURCE GAS

N SOURCE GAS

FIRST
STEP

SECOND
STEP

THIRD
STEP

FOURTH
STEP

PRECEDING
SUPPLY STEP

PRECEDING
SUPPLY STEP

SEMICONDUCTOR DEVICE AND METHOD OF MANUFACTURING SEMICONDUCTOR DEVICE

FIELD

The present invention relates to a semiconductor device and a method of manufacturing the semiconductor device.

BACKGROUND

PTL 1 discloses a heterostructure field effect transistor having AlGaN layers, to which impurities are added, provided therein above and below a high-purity GaN layer and having a hetero stacked film Oobtained by forming hetero-interfaces in two stages. Channels are respectively formed on the GaN layer side of the heterointerfaces between a source and a drain. With such a structure, a plurality of channels are formed in parallel in a device depth direction, and an ON resistance is reduced in inverse proportion to the number of channels. Therefore, an energization loss can be reduced.

CITATION LIST

Patent Literature

[PTL 1] WO2000/65663

SUMMARY

Technical Problem

In the heterostructure field effect transistor as in PTL 1, carbon is incorporated into a channel layer at a high concentration so that a current collapse may be conspicuous. In the heterostructure field effect transistor, a leak current may be generated.

The present invention has been made to solve the above-described problem, and is directed to obtaining a semiconductor device capable of suppressing a current collapse and a leak current and a method of manufacturing the semiconductor device.

Solution to Problem

A semiconductor device according to the present invention includes a substrate, a plurality of semiconductor layers to be overlaid on the substrate and a gate electrode, a drain electrode, and a source electrode provided on the plurality of semiconductor layers, wherein each of the plurality of semiconductor layers includes a channel layer made with GaN and a barrier layer provided in contact with an upper surface of the channel layer and made with $Al_xGa_{1-x}N$, and a carbon concentration of the channel layer included in an uppemlost semiconductor layer among the plurality of semiconductor layers is lower than an average value of carbon concentrations of the channel layers included in the semiconductor layers other than the uppermost semiconductor layer among the plurality of semiconductor layers.

A method of manufacturing a semiconductor device according to the present invention includes a first step of supplying a Ga source gas and an N source gas and growing a lower channel layer made with GaN on a substrate, a second step of supplying the Ga source gas, the N source gas, and an Al source gas and growing a lower barrier layer made with $Al_xGa_{1-x}N$ to contact an upper surface of the lower channel layer, a third step of supplying the Ga source gas and the N source gas with a V/III ratio made higher than that in the first step and growing an upper channel layer made with GaN on the lower barrier layer, a fourth step of supplying the Ga source gas, the N source gas, and the Al source gas and growing an upper barrier layer made with $Al_xGa_{1-x}N$ to contact an upper surface of the upper channel layer and a step of forming a gate electrode, a drain electrode, and a source electrode on the upper barrier layer.

Advantageous Effects of Invention

In the semiconductor device according to the present invention, the carbon concentration of the channel layer included in the uppermost semiconductor layer among the plurality of semiconductor layers is lower than the average value of the carbon concentrations of the channel layers in the lower layers. When the carbon concentration of the channel layer included in the uppermost semiconductor layer that is easily affected by a trap is reduced, a current collapse can be effectively suppressed. The carbon concentrations of the channel layers in the lower layers are set high. Accordingly, an effect of suppressing a leak current by carbon can be obtained.

In the method of manufacturing the semiconductor device according to the present invention, the upper channel layer is grown with the V/III ratio in the third step made higher than that in the first step. Therefore, the carbon concentration of the upper channel layer is lower than the carbon concentration of the lower channel layer. When the carbon concentration of the upper channel layer that is easily affected by a trap is reduced, a current collapse can be effectively suppressed. The carbon concentration of the lower channel layer is set high. Accordingly, an effect of suppressing a leak current by carbon in the lower channel layer can be obtained.

DESCRIPTION OF EMBODIMENTS

Figure 1:
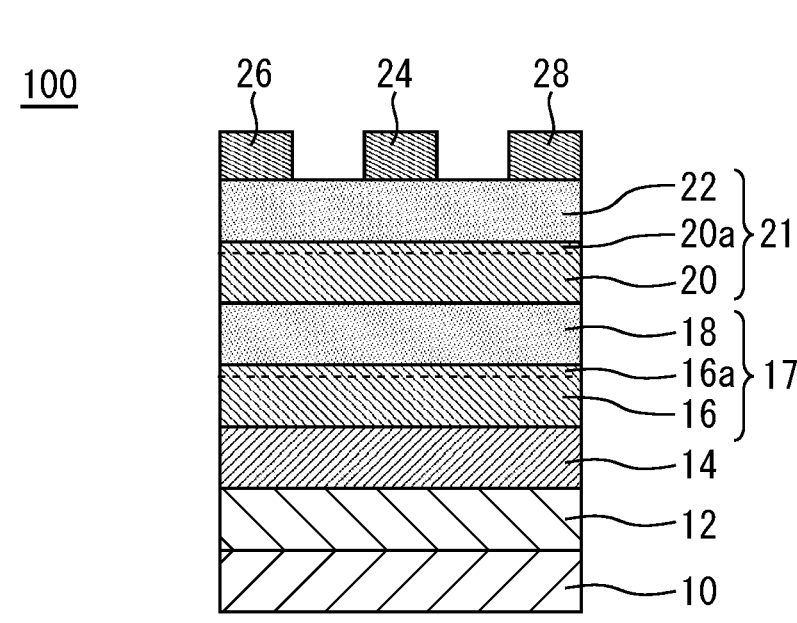
FIG. 1 is a cross-sectional view of a semiconductor device according to the first embodiment.

A semiconductor device and a method of manufacturing the semiconductor device according to an embodiment of the present invention are described with reference to drawings. Identical or corresponding constitutional elements are given the same reference numerals, and the repeated description of such constitutional elements may be omitted.

First Embodiment

FIG. 1 is a cross-sectional view of a semiconductor device 100 according to the first embodiment. The semiconductor device 100 is a high electron mobility transistor (HEMT) using a two-dimensional electron gas. The semiconductor device 100 is formed from a group III nitride semiconductor epitaxial wafer. The semiconductor device 100 includes a substrate 10, a nucleus formation layer 12, a high-resistance layer 14, a lower semiconductor layer 17, an upper semiconductor layer 21, a gate electrode 24, a drain electrode 26, and a source electrode 28. FIG. 1 does not illustrate an actual ratio of the respective thicknesses of the layers.

The substrate 10 is made with silicon carbide. The substrate 10 may be made with not only SiC but also Si, sapphire, or a GaN single crystal. A material for the substrate 10 may be adapted to GaN epitaxial growth. The substrate 10 is preferably of a conductivity type representing a semi-insulating property with a high resistance, but not limited to this.

The nucleus formation layer 12 made with AlN is provided on the substrate 10. The thickness of the nucleus formation layer 12 is 30 nm, for example. The nucleus formation layer 12 is not limited to AlN, but may be $Al_xGa_{1-x}N$. The nucleus formation layer 12 may have a multi-layer structure in which a plurality of $Al_xGa_{1-x}N$ having different compositions overlap one another.

The high-resistance layer 14 is provided on the nucleus formation layer 12. The high-resistance layer 14 is made with GaN. The thickness of the high-resistance layer 14 is 300 nm, for example.

The lower semiconductor layer 17 is provided on the high-resistance layer 14. The lower semiconductor layer 17 includes a lower channel layer 16 made with GaN and a lower barrier layer 18 provided in contact with an upper surface of the lower channel layer 16 and made with $Al_xGa_{1-x}N$. Here, $0<x<1$.

The lower channel layer 16 is an undoped layer that has not been subjected to intended doping. The lower channel layer 16 contains carbon as an impurity. The film thickness of the lower channel layer 16 is 1000 nm, for example. The film thickness of the lower barrier layer 18 is approximately 5 to 10 nm, and is preferably approximately 10 nm. The high-resistance layer 14 need not be provided, but the lower channel layer 16 may be formed on the nucleus formation layer 12.

A lower two-dimensional electron gas layer 16a is formed at an interface with the lower barrier layer 18 in the lower channel layer 16. The lower channel layer 16 as an electron transit layer and the lower barrier layer 18 as an electron supply layer form a heterojunction. At a heterointerface, electrons are stored by a polarization effect, and a two-dimensional electron gas having a high concentration is formed. The lower two-dimensional electron gas layer 16a is a layer in which a two-dimensional electron gas is formed.

The upper semiconductor layer 21 is provided on the lower semiconductor layer 17. The upper semiconductor layer 21 includes an upper channel layer 20 made with GaN and an upper barrier layer 22 provided in contact with an upper surface of the upper channel layer 20 and made with $Al_xGa_{1-x}N$. Here, $0<x<1$.

The upper channel layer 20 is an undoped layer that has not been subjected to intended doping. The upper channel layer 20 contains carbon as an impurity. The carbon concentration of the upper channel layer 20 is lower than the carbon concentration of the lower channel layer 16. The film thickness of the upper channel layer 20 is 5 to 15 nm, and is preferably 10 nm. The film thickness of the upper barrier layer 22 is 20 nm, for example.

An upper two-dimensional electron gas layer 20a is formed at an interface with the upper barrier layer 22 in the upper channel layer 20. The upper channel layer 20 as an electron transit layer and the upper barrier layer 22 as an electron supply layer form a heterojunction. At a heterointerface, electrons are stored by a polarization effect, and a two-dimensional electron gas having a high concentration is formed. The upper two-dimensional electron gas layer 20a is a layer in which a two-dimensional electron gas is formed.

When a distance between the lower two-dimensional electron gas layer 16a and the upper two-dimensional electron gas layer 20a is too long, an intended operation may be unable to be performed as a plurality of channels at the time of a device operation. Accordingly, the sum of the respective film thicknesses of the lower barrier layer 18 and the upper channel layer 20 is preferably 20 nm or less. As a result, the plurality of channels can be made to stably function at the time of the device operation.

The lower barrier layer 18 is desirably structurally designed such that x in $Al_xGa_{1-x}N$ is 0.2 or more. The film thickness of the lower barrier layer 18 is small. Accordingly, a two-dimensional electron gas may not be easily formed in the lower channel layer 16. When x in the lower barrier layer 18 is designed to be sufficiently large, a two-dimensional electron gas can be reliably formed in the lower channel layer 16.

The gate electrode 24, the drain electrode 26, and the source electrode 28 are provided on the upper semiconductor layer 21. A cap layer may be provided between the upper barrier layer 22 and the gate electrode 24, the drain electrode 26, and the source electrode 28. The cap layer is made with a nitride semiconductor such as GaN.

Figure 2:
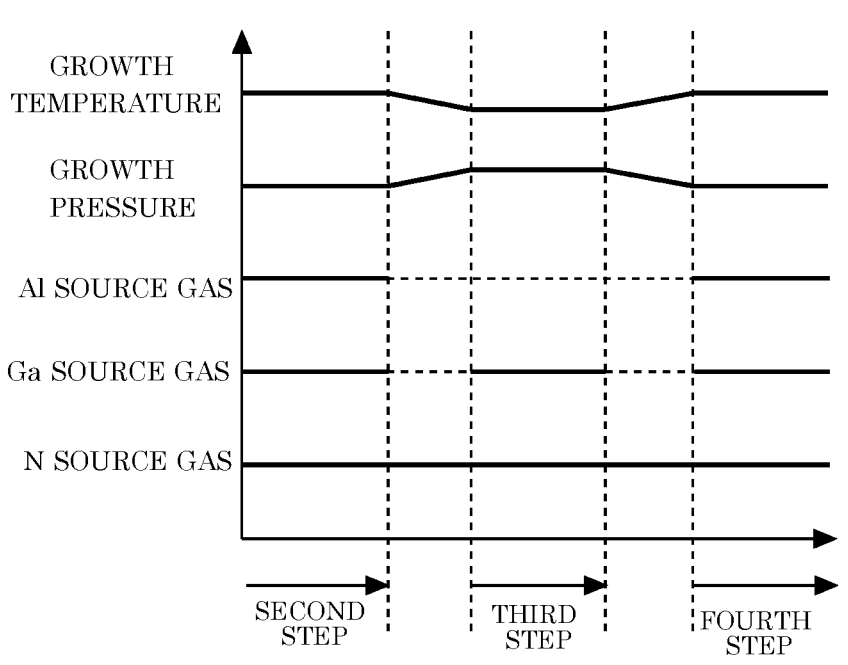
FIG. 2 is a diagram for describing, a method of manufacturing the semiconductor device according to the first embodiment.

FIG. 2 is a diagram for describing a method of manufacturing the semiconductor device 100 according to the first embodiment. FIG. 2 illustrates a condition sequence from a step of forming the lower barrier layer 18 to a step of forming the upper barrier layer 22. Each of a horizontal axis and a vertical axis illustrated in FIG. 2 does not necessarily represent an accurate ratio.

The lower channel layer 16, the lower barrier layer 18, the upper channel layer 20, and the upper barrier layer 22 are each a semiconductor epitaxial layer. The layers are formed by a metalorganic, chemical vapor deposition (MOCVD) method. Not limited to this, but a growth method such as a molecular beam epitaxy method may be used.

In the formation of the semiconductor epitaxial layer, trimethylgallium (TMGa) or triethylgallium (TEGa) as a Ga source gas and trimethylaluminum (TMAl) as an Al source gas are used. Ammonia is used as an N source gas. A carrier gas is hydrogen or nitrogen. Each of the source gases is not limited to these.

First, the nucleus formation layer 12 is formed on the substrate 10 in a growth furnace. A growth temperature in the furnace at the time of formation of the nucleus formation layer 12 is 1100 degrees, for example. Then, the high-resistance layer 14 is formed on the nucleus formation layer 12. At the time of formation of the high-resistance layer 14, Cp2Fe is used as a doping gas. As a result, $1 \times 10^{18}$ cm$^{-3}$, for example, of iron is added to the high-resistance layer 14. Examples of growth conditions include a growth temperature of 1050 degrees, a growth pressure of 200 mbar, and a V/III ratio of 1000. An additive element for increasing the resistance of the high-resistance layer 14 is not limited to Fe, but may be carbon. Both iron and carbon may be simultaneously used.

Then, a first step is performed. In the first step, a Ga source gas and an N source gas are supplied to the substrate 10 in the growth furnace, to grow the lower channel layer 16 on the high-resistance layer 14. Growth conditions of the lower channel layer 16 may be the same as or may be different from those of the high-resistance layer 14.

After the lower channel layer 16 is formed, the supply of the Ga source gas as a group III source gas is stopped. A growth temperature is raised, and a growth pressure is lowered. After completion of a temperature rise and a pressure drop, a second step is performed. In the second step, a Ga source gas, an N source gas, and an Al source gas are supplied to the substrate 10 in the growth furnace, and the lower barrier layer 18 is grown to contact the upper surface of the lower channel layer 16.

The higher the growth temperature is, the more the crystal quality of AlGaN can be improved. The lower the growth pressure is, the more a parasitic reaction occurring between a TMAl gas and another source gas can be suppressed. As a result, consumption of a raw material in a portion other than a portion on the substrate 10 can be suppressed. Silicon or oxygen may be doped into the lower barrier layer 18. Examples of growth conditions include a growth temperature of 1100 degrees and a growth pressure of 50 mbar.

After the lower channel layer 16 is formed, the supply of the Al source gas and the Ga source gas is stopped. The growth temperature is lowered, and the growth pressure is raised. After a target furnace atmosphere has been reached, a third step is performed by starting to supply the Ga source gas. In the third step, a Ga source gas and an N source gas are supplied, to grow the upper channel layer 20 on the lower barrier layer 18.

In the third step, any one of a growth temperature, a growth pressure, and a V/III ratio is made higher than that in the first step. As a result, the carbon concentration of the upper channel layer 20 can be made lower than the carbon concentration of the lower channel layer 16. Two or more of the growth temperature, the growth pressure, and the V/III ratio may be simultaneously increased.

After the upper channel layer 20 is formed, the supply of the Ga source gas is stopped, to raise the growth temperature and lower the growth pressure. After a target furnace atmosphere has been reached, a fourth step is performed. The fourth step is performed under growth conditions such as a high temperature and a low pressure, like in the second step. In the fourth step, a Ga source gas, an N source gas, and an Al source gas are supplied, and the upper barrier layer 22 is grown to contact the upper surface of the upper channel layer 20. Growth conditions of the upper barrier layer 22 may be the same as or different from those at the time of growth of the lower barrier layer 18. Silicon or oxygen may be doped into the upper barrier layer 22.

Then, the gate electrode 24, the drain electrode 26, and the source electrode 28 are formed on the upper barrier layer 22.

The semiconductor device 100 is a high electron mobility transistor made with a group III nitride semiconductor. Generally, the group III nitride semiconductor is an electronic device material that can operate with a high output, at a high efficiency, and in a wideband. The high electron mobility transistor can perform a high speed operation using a two-dimensional electron gas having a high mobility induced in a semiconductor heterojunction as a channel. Further, in the semiconductor device 100, a plurality of two-dimensional electron gases are formed in parallel. As a result, an ON resistance can be more reduced than when the number of two-dimensional electron gas layers is one. Therefore, an energization loss can be reduced, and a higher speed operation can be performed.

Generally in the high electron mobility transistor, electrons are trapped due to an influence of carbon included in a channel layer so that a current collapse may occur. The current collapse is a phenomenon that when a voltage is applied to an electrode to operate a device, electrons are captured in a trap so that a drain current is reduced.

In the present embodiment, electrons in the upper two-dimensional electron gas layer 20a are easily affected by a high voltage to be applied to the electrode. At this time, electrons in the upper two-dimensional electron gas layer 20a are affected by both a trap on a surface of the upper barrier layer 22 and a trap in the upper channel layer 20. Accordingly, a current collapse easily occurs. Therefore, when carbon is incorporated into the upper channel layer 20 at a high concentration, the current collapse may be conspicuous. On the other hand, in the lower two-dimensional electron gas layer 16a, still another semiconductor layer is stacked on an upper surface of the lower barrier layer 18. Accordingly, the lower two-dimensional electron gas layer 16a is less affected by a surface trap than the upper two-dimensional electron gas layer 20a.

Generally in the high electron mobility transistor, a leak current may be generated. The leak current is generated due to the presence of carriers caused by nitrogen vacancies, for example. The leak current can be generally reduced by carbon doping. Accordingly, when the carbon concentration of a channel layer is reduced, a leak current may be increased.

In the semiconductor device 100 according to the present embodiment, the carbon concentration of the upper channel layer 20 is lower than the carbon concentration of the lower channel layer 16. When the carbon concentration of the upper channel layer 20 that is easily affected by a trap is reduced, a current collapse can be effectively suppressed. The carbon concentration of the lower channel layer 16 that is not easily affected by a surface trap is set high. Accordingly, an effect of suppressing a leak current by carbon can be ensured.

Particularly, the upper channel layer 20 is a thin layer having a thickness of approximately 10 nm, while the lower channel layer 16 has a thickness of 1000 nm. The carbon concentration of the thick lower channel layer 16 easily affects a leak current. When the carbon concentration of the lower channel layer 16 is set high, a leak current can be effectively suppressed.

An optimum value of the carbon concentration depends on an electric field design of a transistor, for example. The carbon concentration of the upper channel layer 20 may be $3 \times 10^{16}$ cm$^{-3}$ or less, and the carbon concentration of the lower channel layer 16 may be $1 \times 10^{16}$ cm$^{-3}$ or more. More specifically, the carbon concentration of the upper channel layer 20 may be $2 \times 10^{16}$ cm$^{-3}$, and the carbon concentration of the lower channel layer 16 may be $4 \times 10^{16}$ cm$^{-3}$.

Figure 3:
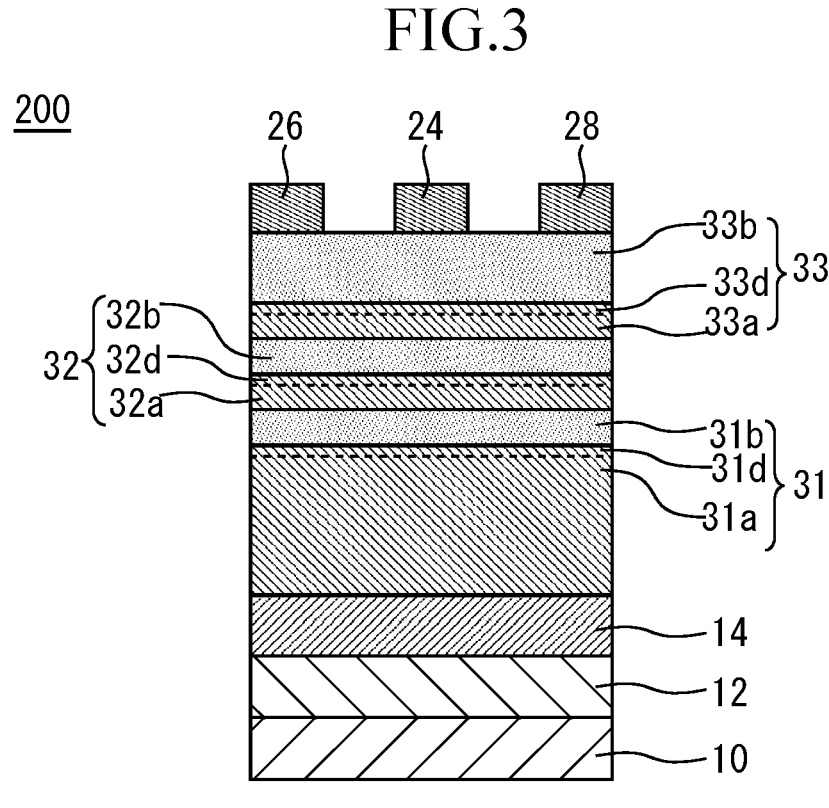
FIG. 3 is a cross-sectional view of a semiconductor device according to a modification to the first embodiment.

FIG. 3 is a cross-sectional view of a semiconductor device 200 according to a modification to the first embodiment. In the first embodiment, the upper semiconductor layer 21 and the lower semiconductor layer 17 each having the stacked structure of the channel layer and the barrier layer are formed in two stages. As the modification, semiconductor layers each having a stacked structure of a channel layer and a barrier layer may be formed in three or more stages.

The semiconductor device 200 according to the modification includes a plurality of semiconductor layers 31, 32, and 33 to be overlaid on the substrate 10. The plurality of semiconductor layers 31, 32, and 33 respectively include channel layers 31a, 32a, and 33a and barrier layers 31b, 32b, and 33b. In the plurality of semiconductor layers 31, 32, and 33, two-dimensional electron gas layers 31d, 32d, and 33d are respectively formed. Accordingly, three or more two-dimensional electron gas layers are formed. Therefore, an ON resistance can be reduced in inverse proportion to the number of two-dimensional electron gas layers 31$d$, 32$d$, and 33$d$.

In the semiconductor device 200, the carbon concentration of the channel layer 33$a$ included in the uppermost semiconductor layer 33 among the plurality of semiconductor layers 31, 32, and 33 is set lower than an average value of the respective carbon concentrations of the channel layers 31$a$ and 32$a$ included in the semiconductor layers 31 and 32 other than the uppermost semiconductor layer 33. As a result, an effect of suppressing a current collapse and suppressing a leak current can be obtained.

In the semiconductor device 200, the channel layer 33$a$ included in the uppermost semiconductor layer 33 is thinner than the channel layer 31$a$ included in the semiconductor layer 31 other than the uppermost semiconductor layer 33. As a result, a leak current can be effectively suppressed by the channel layer 31$a$ in the lower layer.

In the semiconductor device 200, x may be 0.2 or more in the barrier layers 31$b$ and 32$b$ respectively included in the semiconductor layers 31 and 32 other than the uppermost semiconductor layer 33, like in the first embodiment. As a result, a two-dimensional electron gas can be reliably formed in the lower semiconductor layers 31 and 32.

In the semiconductor device 200, the carbon concentration of the channel layer 33$a$ included in the uppermost semiconductor layer 33 may be $3 \times 10^{16}$ cm$^{-3}$ or less, like in the first embodiment. The average value of the respective carbon concentrations of the channel layers 31$a$ and 32$a$ included in the semiconductor layers 31 and 32 other than the uppermost semiconductor layer 33 is $1 \times 10^{16}$ cm$^{-3}$ or more.

To reduce a distance among the two-dimensional electron gas layers 31$d$, 32$d$, and 33$d$, the stun of the respective film thicknesses of the uppermost channel layer 33$a$ and the barrier layer 32$b$ included in the semiconductor layer 32 immediately below the uppermost semiconductor layer 33 may be 20 nm or less. The sum of the respective film thicknesses of the channle layer 32$a$ and the barrier layer 31$b$ may be 20 nm or less.

The uppermost channel layer 33$a$ and the barrier layer 32$b$ included in the semiconductor layer 32 immediately below the uppermost semiconductor layer 33 contact each other. As a result, a distance among the two-dimensional electron gas layers 31$d$, 32$d$, and 33$d$ can be reduced.

These modifications can be applied, as appropriate, to a semiconductor device and a method of manufacturing the semiconductor device according to the following embodiments. Note that the semiconductor device and the method of manufacturing the semiconductor device according to the following embodiments are similar to those of the first embodiment in many respects, and thus differences between the semiconductor device and the method of manufacturing the semiconductor device according to the following embodiments and those of the first embodiment will be mainly described below.

Second Embodiment

Figure 4:
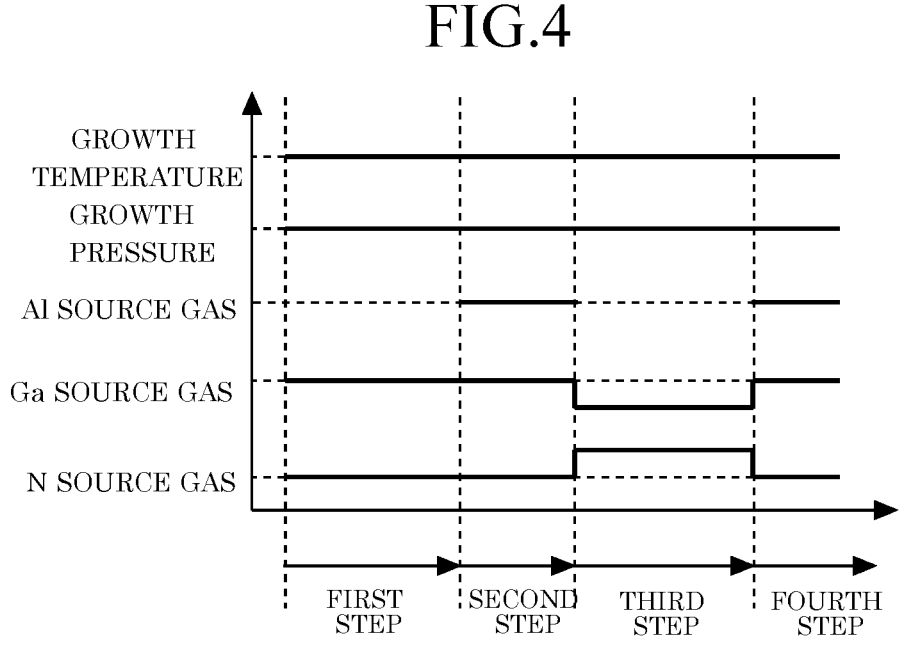
FIG. 4 is a diagram for describing a method of manufacturing a semiconductor device according to the second embodiment.

FIG. 4 is a diagram for describing a method of manufacturing a semiconductor device 100 according to the second embodiment. A structure of the semiconductor device 100 manufactured in the manufacturing method according to the present embodiment is similar to that in the first embodiment. FIG. 4 illustrates a condition sequence from a step of forming a lower channel layer 16 to a step of forming an upper barrier layer 22.

A first step is performed with a growth temperature previously raised and a growth pressure previously lowered to match growth conditions in a second step. After the first step is performed, a second step is performed by starting to supply an Al source gas with a growth pressure, a growth temperature, and a carrier gas flow rate maintained. A standby time period is not provided between the first step and the second step. Therefore, the lower channel layer 16 and a lower barrier layer 18 are continuously formed without performing growth interruption.

After the second step is performed, a third step is performed by stopping supplying the Al source gas with the growth pressure, the growth temperature, and the carrier gas flow maintained. A standby tune period is not provided between the second step and the third step. Therefore, the lower barrier layer 18 and an upper channel layer 20 are continuously formed without performing growth interruption.

In the third step, the upper channel layer 20 is grown with a V/III ratio made higher than that in the first step. That is, a supply amount of a Ga source gas is more decreased and a supply amount of an N source gas is more increased than those in the first step. Not limited to this, but one of the decrease in the supply amount of the Ga source gas and the increase in the supply amount of the N source gas may be performed. As a result, carbon can be prevented from being incorporated into GaN. Therefore, the carbon concentration of the upper channel layer 20 can be made lower than the carbon concentration of the lower channel layer 16. The V/III ratio in the first step is 1000, for example, and the V/III ratio in the third step is 10000, for example.

After the upper channel layer 20 is formed, a fourth step is performed by starting to supply an Al source gas with a growth pressure, a growth temperature, and a carrier gas flow rate maintained. A standby time period is not provided between the third step and the fourth step. Therefore, the upper channel layer 20 and an upper barrier layer 22 are continuously formed without performing growth interruption. In the fourth step, respective supply amounts of a Ga source gas and an N source gas are returned to the same supply amounts in the first step.

Thus, in the present embodiment, the growth pressure and the growth temperature are kept constant from the first step to the fourth step. The lower channel layer 16, the lower barrier layer 18, the upper channel layer 20, and the upper barrier layer 22 are continuously formed without performing growth interruption.

Figure 5:
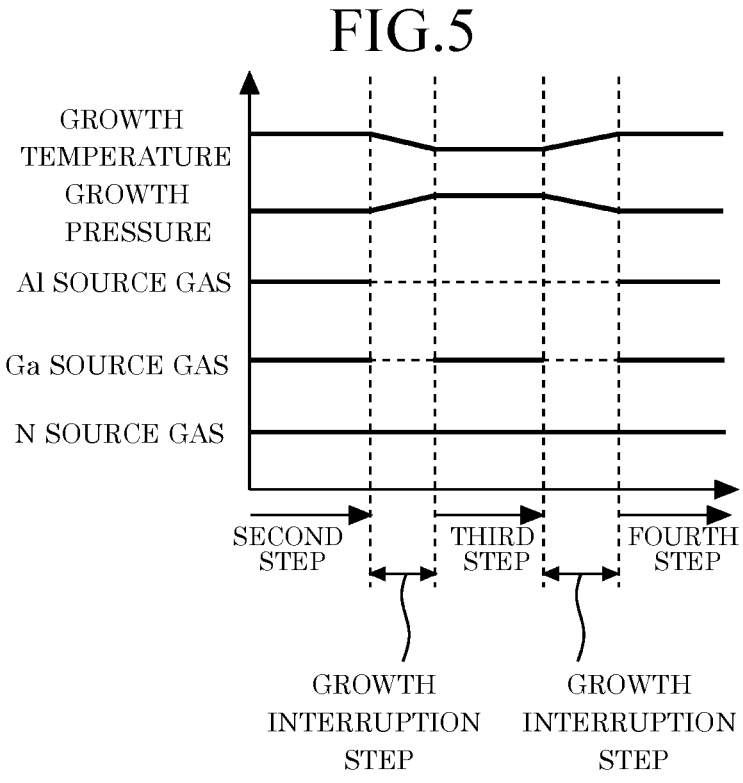
FIG. 5 is a diagram for describing a method of manufacturing a semiconductor device according to a comparative example.

FIG. 5 is a diagram for describing a method of manufacturing a semiconductor device 100 according to a comparative example. In the manufacturing method in the first embodiment illustrated in FIG. 5, a growth interruption step occurs between steps due to a transition of a growth furnace atmosphere. In the growth interruption step, a surface of a substrate 10 is exposed to a carrier gas atmosphere such as hydrogen under a high temperature. As a result, etching, may occur.

In a growth interruption step between a second step and a third step, a lower barrier layer 18 is etched. As a result, surface roughness of the lower barrier layer 18 occurs. An upper channel layer 20 grows after the roughness of the lower barrier layer 18 is taken over. If the upper channel layer 20 is sufficiently thick, flatness of its surface can be recovered. However, the upper channel layer 20 is thin in the present embodiment. In this case, the surface of the upper channel layer 20 easily enters a roughened state.

At this time, a trap or the like is formed at an interface between the upper channel layer 20 and an upper barrier layer 22 so that a device characteristic deteriorates. The film thickness of the lower barrier layer 18 decreases by etching so that an intended structure may not be obtained.

Further, in a growth interruption step between the third step and a fourth step, the upper channel layer 20 is etched. Particularly, GaN is more easily etched than $Al_xGa_{1-x}N$. Accordingly, in the growth interruption step between the third step and the fourth step, the upper channel layer 20 may all disappear. In this case, an upper two-dimensional electron gas layer 20a may not be formed in addition to the deterioration in the device characteristic.

On the other hand, growth interruption is not performed in the present embodiment. In this case, a damage to the interface by etching during growth interruption does not occur. Accordingly, the device characteristic can be prevented from deteriorating. Flatness of a lower layer is obtained with high reproducibility on an upper layer. A stacked structure of two-dimensional electron gases can be stably formed.

In the present embodiment, a V/III ratio is increased in the third step. If the V/III ratio is high, migration is insufficient so that a growth surface may be roughened. However, if the film thickness of the upper channel layer 20 is approximately 10 nm, growth is completed with flatness of a lower layer taken over. Accordingly, the growth surface can be prevented from being roughened.

It is particularly effective when growth interruption is not performed to adjust a carbon concentration by increasing a V/III ratio. If growth interruption is not performed, a furnace pressure and a furnace temperature cannot be changed. That is, a changeable growth condition is only a source gas flow rate. A plurality of identical source gas lines may be previously provided to switch the line used at the time of switching the step. As a result, the flow rate of a source gas can be changed without applying an impact to a furnace.

As described above, to avoid a parasitic reaction at the time of formation of $Al_xGa_{1-x}N$, respective growth pressures at the time of formation of the lower barrier layer 18 and the upper barrier layer 22 are preferably low. In this case, when growth interruption is not performed, the upper channel layer 20 is formed with the growth pressure being low. At this time, an undecomposed methyl group is incorporated in a large amount from a source gas into the upper channel layer 20 so that a carbon concentration may be high. Therefore, when the carbon concentration of the upper channel layer 20 is significantly higher than that of the lower channel layer 16 so that a current collapse may significantly appear.

On the other hand, in the present embodiment, a V/III ratio is made high in the third step. Accordingly, carbon can be prevented from being incorporated into GaN. Therefore, the carbon concentration of the upper channel layer 20 can be suppressed even with a growth pressure being low.

As a modification to the present embodiment, some of steps from a first step to a fourth step may be performed without performing growth interruption. For example, a growth pressure, a growth temperature, and a carrier gas flow rate may be kept constant from the second step to the fourth step. In this case, after the first step is performed, the growth temperature is raised, and the growth pressure is lowered. Then, a lower barrier layer 18, an upper channel layer 20, and an upper barrier layer 22 are continuously formed without performing growth interruption.

The manufacturing method according to the present embodiment may be applied to a structure in which stacked structures each including a channel layer and a barrier layer are formed in three or more stages, like in the semiconductor device 200. In this case, steps from a step of forming the lowermost barrier layer to a step of forming the uppermost barrier layer are performed with a growth temperature and a growth pressure kept constant, for example. That is, the barrier layers from the lowermost barrier layer to the uppermost barrier layer are continuously formed without performing growth interruption.

In this case, in order that the carbon concentration of the uppermost channel layer is lower than an average value of the respective carbon concentrations of the channel layers other than the uppermost channel layer, a V/III ratio is controlled at the time of formation of each of the channel layers.

Third Embodiment

Figure 6:
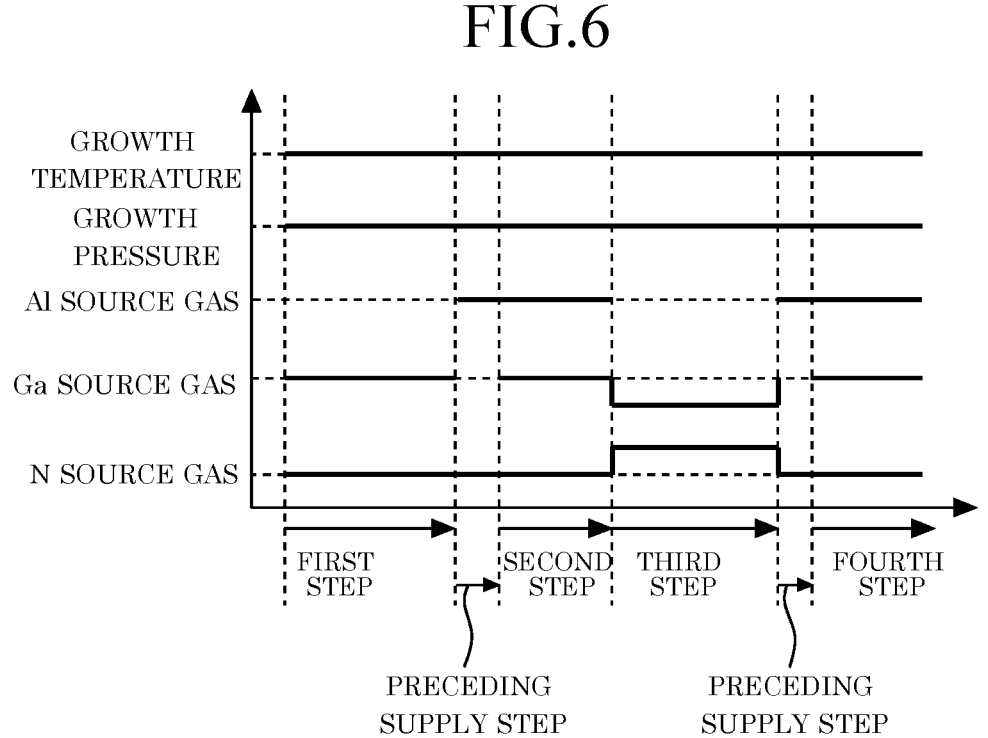
FIG. 6 is a diagram for describing a method of manufacturing a semiconductor device according to the third embodiment.

FIG. 6 is a diagram for describing a method of manufacturing a semiconductor device 100 according to the third embodiment. A structure of the semiconductor device 100 manufactured in the manufacturing method according to the present embodiment is similar to that in the first embodiment. FIG. 6 illustrates a condition sequence from a step of forming a lower channel layer 16 to a step of forming an upper barrier layer 22.

In the present embodiment, a preceding supply step is provided immediately before a second step and immediately before a fourth step. The preceding supply step is a step of not supplying a Ge source gas but supplying an Al source gas. Preceding supply of the Al source gas prevents a transition layer of an Al composition from being formed at a heterointerface between a channel layer and a barrier layer. At the heterointerface, the transition layer of the Al composition is thinned. As a result, sharpness of the heterointerface can be improved, and a device characteristic can be improved.

Not limited to this, but a step of not supplying a Ga source gas but supplying an Al source gas may be provided between a first step and the second step or between a third step and the fourth step.

Note that the technical features described in the above embodiments may be combined as appropriate.

REFERENCE SIGNS LIST 100, 200 semiconductor device, 10 substrate, 16 lower channel layer, 17 lower semiconductor layer, 18 lower barrier layer, 20 upper channel layer, 21 upper semiconductor layer, 22 upper barrier layer, 24 gate electrode, 26 drain electrode, 28 source electrode, 31, 32, 33 semiconductor layer, 31a, 32a, 33a channel layer, 31b, 32b, 33b barrier layer

The invention claimed is:

1. A semiconductor device comprising:
    a substrate;
    a plurality of pairs of semiconductor layers on the substrate; and
    a gate electrode, a drain electrode, and a source electrode provided on the plurality of pairs of semiconductor layers, wherein
    each of the plurality of pairs of semiconductor layers includes a channel layer made with GaN and a barrier layer provided in contact with an upper surface of the channel layer and made with $Al_xGa_{1-x}N$,
    a carbon concentration of the channel layer included in an uppermost pair of semiconductor layers among the plurality of pairs of semiconductor layers is lower than an average value of carbon concentration of the channel layers included in the pairs of semiconductor layers other than the uppermost pair of semiconductor layers, and the uppermost pair of semiconductor layers is an uppermost pair of channel and barrier layers in the semiconductor device.

2. The semiconductor device according to claim 1, wherein a two-dimensional electron gas is formed at an interface with the barrier layer in the channel layer in each of the plurality of pairs of semiconductor layers.

3. The semiconductor device according to claim 1, wherein the channel layer included in the uppermost pair of semiconductor layers is thinner than the channel layer included in one of the pairs of semiconductor layers other than the uppermost pair of semiconductor layers.

4. The semiconductor device according to claim 1, wherein the carbon concentration of the channel layer included in the uppermost pair of semiconductor layers is lower than the carbon concentration of the channel layer included in the pair of semiconductor layers immediately below the uppermost pair of semiconductor layers.

5. The semiconductor device according to claim 1, wherein the channel layer included in the uppermost pair of semiconductor layers and the barrier layer included in the pair of semiconductor layers immediately below the uppermost pair of semiconductor layers contact each other.

6. The semiconductor device according to claim 1, wherein a sum of respective film thicknesses of the channel layer included in the uppermost pair of semiconductor layers and the barrier layer included in the pair of semiconductor layers immediately below the uppermost pair of semiconductor layers is 20 nm or less.

7. The semiconductor device according to claim 1, wherein in each barrier layer included in each of the pairs of semiconductor layers other than the uppermost pair of semiconductor layers-layer, x is 0.2 or more.

8. The semiconductor device according to claim 1, wherein the carbon concentration of the channel layer included in the uppermost pair of semiconductor layers is $3\times10^{16}$ cm$^{-3}$ or less.

9. The semiconductor device according to claim 1, wherein the average value of the carbon concentration of the channel layer included in each of the pairs of semiconductor layers other than the uppermost pair of semiconductor layers is $1\times10^{16}$ cm$^{-3}$ or more.

10. The semiconductor device according to claim 1, wherein the channel layer included in an uppermost pair of semiconductor layers among the plurality of pairs of semiconductor layers includes carbon as an impurity.

* * * * *